(12) United States Patent
Kaneko et al.

(10) Patent No.: US 7,307,250 B2
(45) Date of Patent: Dec. 11, 2007

(54) LIGHT-RECEIVING ELEMENT AND MANUFACTURING METHOD OF THE SAME, OPTICAL MODULE AND OPTICAL TRANSMITTING DEVICE

(75) Inventors: Tsuyoshi Kaneko, Shimosuwa-machi (JP); Hajime Onishi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 239 days.

(21) Appl. No.: 10/769,861

(22) Filed: Feb. 3, 2004

(65) Prior Publication Data
US 2004/0160676 A1 Aug. 19, 2004

(30) Foreign Application Priority Data
Feb. 6, 2003 (JP) ............... 2003-029654

(51) Int. Cl.
*H01J 3/14* (2006.01)
*H01L 27/00* (2006.01)
*H01L 31/0232* (2006.01)
*H01L 31/0203* (2006.01)

(52) U.S. Cl. ............... 250/208.1; 250/216; 257/432; 257/433

(58) Field of Classification Search ............ 250/214.1, 250/239, 208.1, 216; 257/294, 80–84, 432–436, 257/291, 431; 438/65; 359/642
See application file for complete search history.

(56) References Cited

U.S. PATENT DOCUMENTS

| | | | | |
|---|---|---|---|---|
| 3,959,646 | A * | 5/1976 | DE Cremoux | ............... 257/438 |
| 5,471,948 | A * | 12/1995 | Burroughes et al. | .......... 438/93 |
| 5,498,684 | A | 3/1996 | Bender | |
| 5,707,684 | A | 1/1998 | Hayes et al. | |
| 6,252,218 | B1 * | 6/2001 | Chou | ...................... 250/208.1 |
| 6,597,720 | B2 | 7/2003 | Kondo | |
| 6,794,215 | B2 * | 9/2004 | Park et al. | ..................... 438/69 |
| 6,794,631 | B2 * | 9/2004 | Clark | ....................... 250/214.1 |
| 6,894,322 | B2 * | 5/2005 | Kwan et al. | ................ 257/186 |

FOREIGN PATENT DOCUMENTS

JP U-58-180648 2/1983

(Continued)

OTHER PUBLICATIONS

Kim et al. "New Fabrication Technology of Convex and Concave Microlens Using UV Curing Method". Lasers and Electro-Optics Society 1999, 12th Annual Meeting. LEOS '99. IEEE vol. 2, 1999, pp. 639-640.*

*Primary Examiner*—Thanh X. Luu
*Assistant Examiner*—Pascal M Bui-Pho
(74) *Attorney, Agent, or Firm*—Oliff & Berridge, PLC

(57) ABSTRACT

To provide a light-receiving element capable of high-speed operation including an optical member whose setting position, shape and size are advantageously controlled and its manufacturing method, and an optical module and an optical transmitting device including the light-receiving element, a light-receiving element includes a columnar part provided in a substrate. A top surface of the columnar part includes a receiving surface, and an optical member is provided on the top surface of the columnar part. The columnar part includes a first conductive type layer, a light absorbing layer, and a second conductive type layer. The light absorbing layer is formed between the first conductive type layer and the second conductive type layer.

23 Claims, 7 Drawing Sheets

FOREIGN PATENT DOCUMENTS

| | | |
|---|---|---|
| JP | A-63-182850 | 7/1988 |
| JP | A-01-239973 | 9/1989 |
| JP | A-02-185070 | 7/1990 |
| JP | A 5-102513 | 4/1993 |
| JP | A 5-120722 | 5/1993 |
| JP | A-05-183185 | 7/1993 |
| JP | A-06-104536 | 4/1994 |
| JP | A-07-226531 | 8/1995 |
| JP | A-08-036059 | 2/1996 |
| JP | A-10-012912 | 1/1998 |
| JP | A-11-017211 | 1/1999 |
| JP | A 2000-67449 | 3/2000 |
| JP | A-2000-068491 | 3/2000 |
| JP | A-2001-66299 | 3/2001 |
| JP | A-2001-196644 | 7/2001 |
| JP | A-2001-284725 | 10/2001 |
| JP | A-2001-320081 | 11/2001 |
| JP | A-2002-100758 | 4/2002 |
| JP | A-2002-353511 | 12/2002 |
| JP | A-2002-353512 | 12/2002 |
| JP | A 2003-240911 | 8/2003 |
| JP | A 2003-258380 | 9/2003 |

\* cited by examiner

F I G. 1
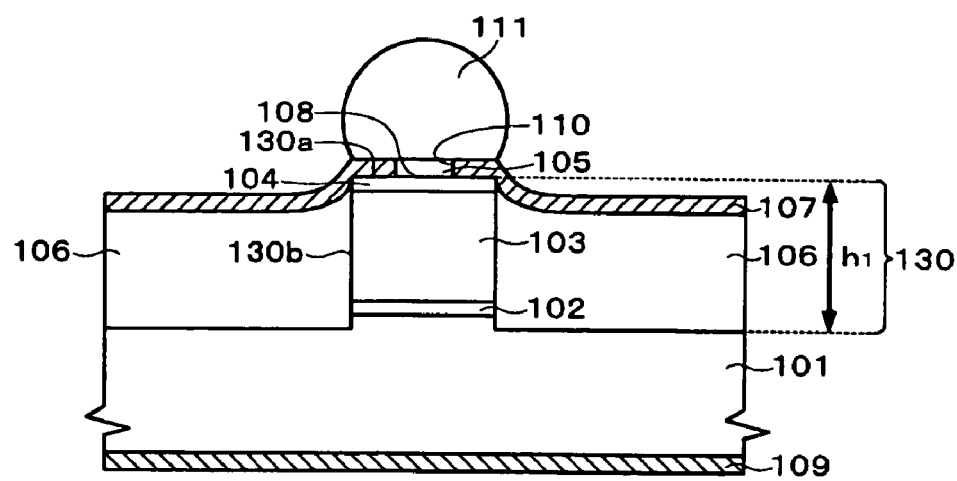
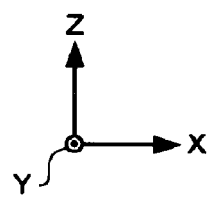

LIGHT-RECEIVING ELEMENT AND MANUFACTURING METHOD OF THE SAME, OPTICAL MODULE AND OPTICAL TRANSMITTING DEVICE

BACKGROUND OF THE INVENTION

1. Field of Invention

The present invention relates to a light-receiving element and its manufacturing method, and an optical module and an optical transmitting device including the light-receiving element.

2. Description of Related Art

A light-receiving element is an element to receive light and convert the light into electricity, which is used for optical communication and optical operation. See for example Japanese laid-open patent publication No. 5-102513 and Japanese laid-open patent publication No. 5-120722. In some applications, the need to control optical properties, such as radiation angle and wavelength of light, arises. In addition, in recent years, when a light-receiving element is applied to optical communication, higher-speed operation has been required for the light-receiving element.

SUMMARY OF THE INVENTION

The present invention provides a light-receiving element capable of high-speed operation including an optical member whose setting position, shape, and size are controlled, and its manufacturing method.

The present invention also provides an optical module and an optical transmitting device including the light-receiving element.

A light-receiving element according to an aspect of the present invention, includes a columnar part provided in a substrate; a top surface of the columnar part including a light-receiving surface; and an optical member being provided on the top surface of the columnar part; the columnar part including a first conductive type layer, a light absorbing layer, and a second conductive type layer, and the light absorbing layer being formed between the first conductive type layer and the second conductive type layer.

The "optical member" refers to a member having a function of changing optical properties and a traveling direction of light entering the light-receiving surface of the light-receiving element. "Optical properties" include wavelength, deflection, and radiation angle, for example. As such an optical member, a lens or deflecting element are examples.

Furthermore, "an optical member being provided on the top surface of the columnar part" includes not only a case where the top surface of the columnar part are in contact with the optical member, but also a case where, for example, a structure, such as an electrode, is provided on a part of a region in the top surface of the columnar part and the optical member is provided on the top surface of the columnar part via this structure.

According to the light-receiving element of an aspect of the present invention, by having the above-described structure, the light-receiving element capable of high-speed operation including the optical member whose setting position, shape, and size are advantageously controlled can be obtained.

The light-receiving element according to the present invention can take the following aspects of (1) through (9).

(1) Incident light through the light-receiving surface propagates in the second conductive type layer and then enters the light absorbing layer, the light absorbing layer can absorb light having a predetermined wavelength, and the second conductive type layer cannot absorb the light having the predetermined wavelength. "Light having a predetermined wavelength" can be adjusted in each case in accordance with types and compositions of the light absorbing layer and the second conductive type layer. This structure allows the film thickness of the second conductive type layer to be increased without reducing the light absorption efficiency in the light absorbing layer. That is, the height of the columnar part can be increased while maintaining the light utilizing efficiency. Thereby, the optical member can be securely set on the top surface of the columnar part.

For example, the incident light from the light-receiving surface propagates in the second conductive type layer and then enters the light absorbing layer, the first conductive type layer and the light absorbing layer can contain gallium and arsenic as main components and the second conductive type layer can contain gallium (Ga), arsenic (As), and aluminum (Al) as main components. This structure allows the light absorbing layer to absorb light having a predetermined wavelength and the second conductive type layer not to absorb the light having the predetermined wavelength.

The "main components" are assumed not to contain impurities. That is, the first and the second conductive type layers contain impurities for determining the conductive type in addition to the main components.

(2) The optical member can function as a lens or deflecting element.

(3) The optical member can have a spherical shape or elliptical spherical shape.

(4) The optical member can have a cut spherical shape or cut elliptical spherical shape. The "cut spherical shape" refers to a shape obtained by cutting a circular sphere in a plane, and the spherical shape includes not only a complete circular sphere but also an approximate circular sphere. In addition, the "cut elliptical spherical shape" refers to a shape obtained by cutting an elliptical sphere in a plane, and the elliptical spherical shape includes not only a complete elliptical sphere but also an approximate elliptical sphere.

In this case, a cross section of the optical member can be circular or elliptical. Furthermore, in this case, a function as a lens or deflecting element can be applied to the optical member.

(5) The optical member can be formed by curing a curable liquid material by applying energy thereto.

In this case, the optical member can be made of UV-curable resin.

(6) The top surface of the columnar part can be circular or elliptical.

(7) A side wall of the columnar part can be covered by an insulating layer.

In this case, in the vicinity of the columnar part, the insulating layer can have a thicker film thickness as it becomes closer to the columnar part. This structure allows the optical member to be securely set on the top surface of the columnar part.

(8) An electrode can be formed on the top surface of the columnar part, the electrode can have an opening, and the light-receiving surface can be formed on the opening.

(9) The light-receiving element can be a photodiode.

A manufacturing method of a light-receiving element according to an aspect of the present invention, includes (a) forming a columnar part including a light-receiving surface on a top surface thereof on a substrate, the columnar part including a first conductive type layer, a light absorbing layer, and a second conductive type layer, and the light absorbing layer being formed between the first conductive type layer and the second conductive type layer; (b) forming an optical member precursor by discharging a droplet to the top surface of the columnar part; and (c) forming an optical member by curing the optical member precursor.

According to the manufacturing method of the light-receiving element of an aspect of the present invention, in the step (b), by adjusting the discharging amount of droplet, the light-receiving element, which is capable of high-speed operation including the optical member whose setting position, shape and size are advantageously controlled, can be provided.

The manufacturing method of the light-receiving element according to the present invention can have the following aspects of (1) and (2).

(1) The manufacturing method can include the step of (d) adjusting the wettability of the top surface of the columnar part with respect to the droplet, prior to the step (b). This enables the optical member having a desired shape and size to be formed. For example, by forming a lyophilic or liquid-repellent film with respect to the droplet on the top surface of the columnar part, the wettability of the top surface of the light-receiving surface with respect to the droplet can be controlled.

(2) In the step (a), an insulating layer covering a side wall of the columnar part is formed, and the insulating layer is deposited so as to cover the top surface of the columnar part. Then by conducting an isotropic etching against the insulating layer in the direction from the top surface of the columnar part to the substrate, in the vicinity of the columnar part, the insulating layer has a thicker film thickness as it becomes closer to the columnar part. The "film thickness of the insulating layer" refers to a film thickness in the perpendicular direction to the setting surface of the columnar part in the substrate.

The present invention can be applied to an optical module including the light-receiving element according to an aspect of the present invention and a light guide. Furthermore, the present invention can be applied to an optical transmitting device including the optical module.

BRIEF DESCRIPTION OF THE DRAWINGS

FIG. 1 is a schematic cross sectional view showing a light-receiving element according to a first exemplary embodiment of the present invention;

DETAILED DESCRIPTION OF EXEMPLARY EMBODIMENTS

Hereinafter, the exemplary embodiments of the present invention will be described referring to the accompanying figures.

First Exemplary Embodiment

1. Structure of Light-Receiving Element

Figure 2:
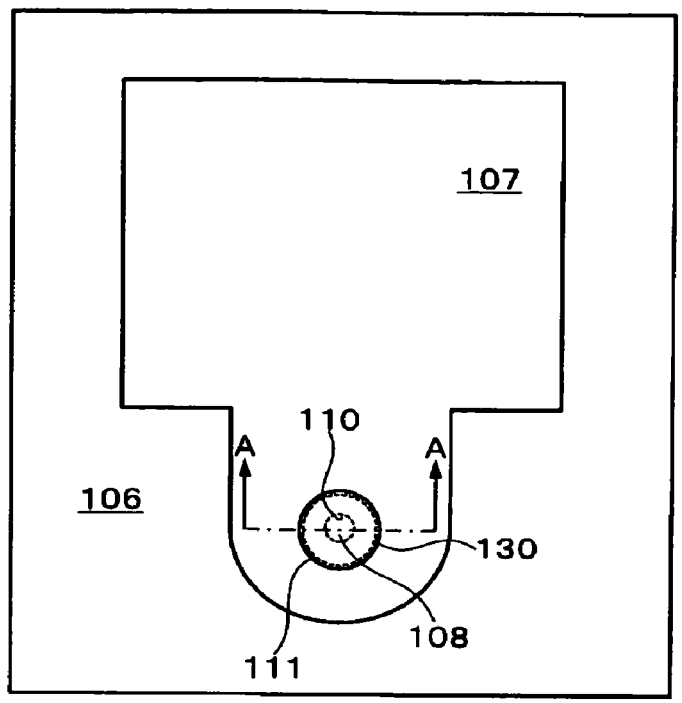
FIG. 2 is a schematic plan view showing the light-receiving element according to the first exemplary embodiment of the present invention.
Figure 2:
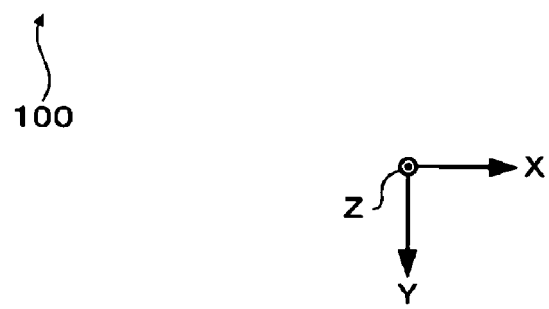

FIG. 1 is a schematic cross sectional view showing a light-receiving element 100 according to a first exemplary embodiment of the present invention. FIG. 2 is a schematic plan view showing the light-receiving element 100 according to the first exemplary embodiment of the present invention. FIG. 1 shows a cross section taken along the plane A-A of FIG. 2. As for the exemplary embodiment, the case where the light-receiving element 100 is a photodiode will be described.

As shown in FIG. 1, the light-receiving element 100 according to the exemplary embodiment includes a semiconductor substrate 101 made of an n-type GaAs substrate and a columnar part 130 formed on the semiconductor substrate 101. The columnar part 130 is a columnar semiconductor stacked structure formed on the semiconductor substrate 101.

A top surface 130a of the columnar part 130 includes a light-receiving surface 108. As for the light-receiving element 100 of the exemplary embodiment, light enters through the light-receiving surface 108. As for the light-receiving element 100 of the exemplary embodiment, a portion (opening 110), which is not covered with a first electrode 107 (described later) in the top surface 130a of the columnar part 130, is provided. The region inside of the opening 110 in the top surface 130a of the columnar part 130 is the light-receiving surface 108.

Furthermore, an optical member 111 is provided on the top surface 130a of the columnar part 130. As for the exemplary embodiment, the case where the optical member 111 functions as a lens will be described. That is, as shown in FIGS. 1 and 2, the light converged by the optical member 111 is allowed to enter the light-receiving surface 108.

Optical Member

The optical member 111 is formed by curing a curable liquid material (for example, a precursor of UV-curable resin or thermosetting resin) with application of energy, such as heat or light. As for the UV-curable resin, UV-curable acrylic resin and epoxy resin are exemplified. As for the thermosetting resin, thermosetting polyimide resin or the like are exemplified.

The precursor of UV-curable resin is cured by short-time ultraviolet irradiation. Accordingly, the UV-curable resin can be cured without going through the step, such as heating in which the element is apt to be damaged. Thus, when the optical member 111 is formed using the precursor of UV-curable resin, influences on the element can be reduced.

Figure 8:
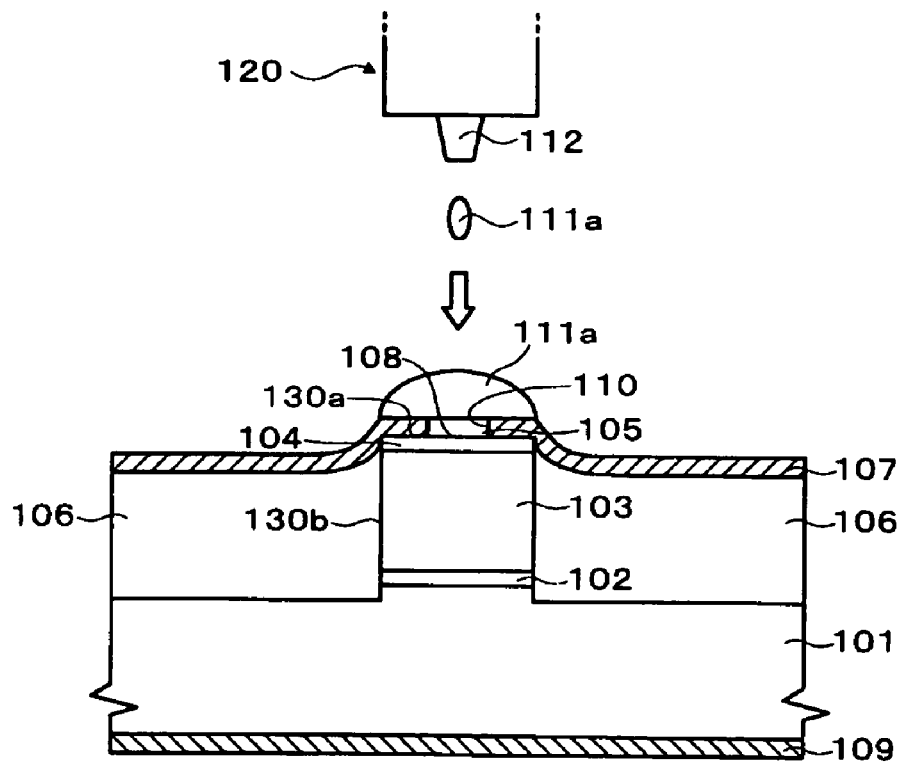
FIG. 8 is a schematic cross sectional view showing an exemplar manufacturing step of the light-receiving element in FIGS. 1 and 2.
Figure 9:
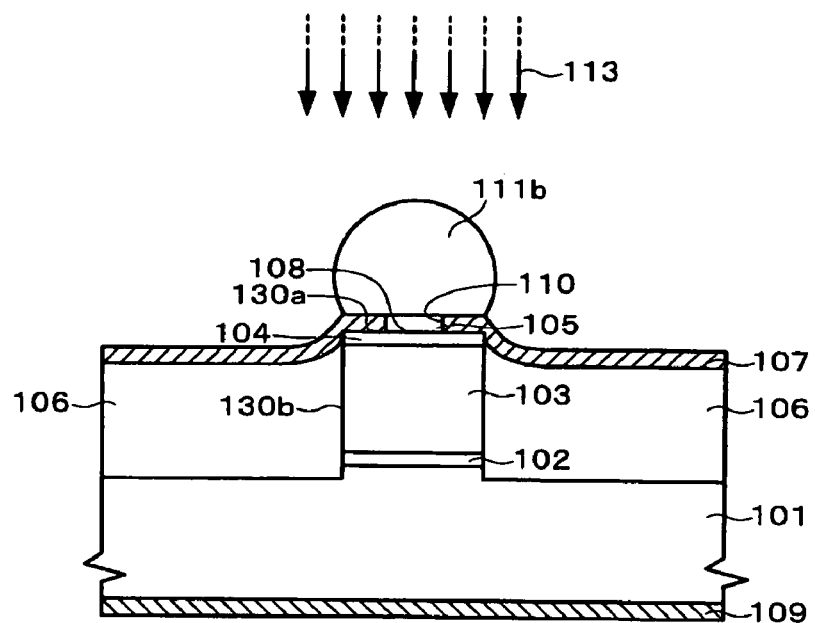
FIG. 9 is a schematic cross sectional view showing an exemplary manufacturing step of the light-receiving element in FIGS. 1 and 2.

As for the exemplary embodiment, specifically, the optical member 111 is formed by discharging a droplet 111a made of the liquid material on the top surface 130a of the columnar part 130 to form an optical member precursor 111b and curing the optical member precursor 111b (refer to FIGS. 8 and 9). A method for forming the optical member 111 will be described later.

Other Components

As above described, the light-receiving element 100 includes the semiconductor substrate 101 and the columnar part 130 formed on the semiconductor substrate 101.

The columnar part 130 is formed by etching a portion in the light-receiving element 100 from the light-receiving surface 108 side to the middle of the substrate 101 so as to form a circular shape as viewed from the light-receiving surface 108 side. As for the exemplary embodiment, although the plane shape of the columnar part 130 is circular, the shape may take any other shape. However, when the optical member 111 is used, for example, as a lens or deflecting element, the top surface 130a of the columnar part 130 should be circular. This allows the three-dimensional shape of the optical member 111 to be a circular sphere or cut circular sphere, thereby the resultant optical member 111 can be used as a lens or deflecting element.

The columnar part 130 includes a first conductive type layer 102, a light absorbing layer 103, and a second conductive type layer 104. As for the light-receiving element 100 according to the exemplary embodiment, the light-receiving surface 108 is provided on the top surface of the second conductive type layer 104. Accordingly, light entering the second conductive type layer 104 through the light-receiving surface 108 propagates in the second conductive type layer 104 and then enters the light absorbing layer 103. In this case, the columnar part 130 can be formed by depositing, for example, the first conductive type layer 102 made of an n-type GaAs layer, the light absorbing layer 103 made of a GaAs layer with no impurities doped, and the second conductive type layer 104 made of a p-type GaAs layer on the substrate 101 made of an n-type GaAs layer, in the order described as above. In this case, for example, the first conductive type layer 102 can have a film thickness of 0.5 μm, the light absorbing layer 103 can have a film thickness of 3.5 μm, and the second conductive type layer 104 can have a film thickness of 0.1 μm. However, the compositions and thickness of respective layers composing the first conductive type layer 102, the light absorbing layer 103, and the second conductive type layer 104 are not limited to the above-described example.

The second conductive type layer 104 is made into a p-type, for example, by doping C (carbon), and the first conductive type layer 102 is made into a n-type, for example, by doping Si (silicone). Thus, a pin diode is made from the second conductive type layer 104, the light absorbing layer 103 in which impurities are not doped, and the first conductive type layer 102.

The second conductive type layer 104 has a carrier density so that it can take an ohmic contact with an electrode (the first electrode 107 to be described later).

Furthermore, the columnar part 130 is embedded in an insulating layer 106. That is, a side wall 130b of the columnar part 130 is encompassed with the insulating layer 106. As for the light-receiving element 100 according to the exemplary embodiment, the insulating layer 106 covers the side wall 130b of the columnar part 130 and the top surface of the substrate 101.

In the vicinity of the columnar part 130, the insulating layer 106 has a thicker film thickness as it becomes closer to the columnar part 130. Thereby, by discharging the droplet 111a onto the top surface 130a of the columnar part 130, the optical member 111 is securely set on the top surface 130a of the columnar part 130. Furthermore, in the light-receiving element 100 according to the exemplary embodiment, the first electrode 107 having a substantially uniform film thickness is formed on the top surface 130a of the columnar part 130 and the top surface of the insulating layer 106, and an anti-reflective layer 105 (described later) is set on the light-receiving surface 108. That is, the optical member 111 is set on the top surface 130a of the columnar part 130 via the first electrode 107 or the anti-reflective layer 105.

In the manufacturing steps of the light-receiving element 100, after the insulating layer 106 covering the side wall 130b of the columnar part 130 is formed, the first electrode 107 is formed on the top surface 130a of the columnar part 130 and the top surface of the insulating layer 106, and a second electrode 109 is formed on the back surface of the semiconductor substrate 101 (the surface opposite to the surface of the semiconductor substrate 101, on which the columnar part 130 is set). When forming these electrodes, an annealing treatment is generally carried out at about 400° C. (refer to the manufacturing process described later). Accordingly, in the case where the insulating layer 106 is formed using resin, the resin composing the insulating layer 106 needs to be excellent in heat resistance so as to withstand the annealing treatment. In order to satisfy this requirement, the resin composing the insulating layer 106 is preferably polyimide resin, fluorocarbon resin, acrylic resin, or epoxy resin, more preferably polyimide resin or fluorocarbon resin from the viewpoint of easiness in processing and insulation performance. Furthermore, in the case where the optical member (for example, lens) is formed on the insulating layer 106 using resin as a raw material, the insulating layer 106 is preferably made of polyimide resin or fluorocarbon resin from the viewpoint of large contact angle with the lens material (resin) and easiness in controlling the lens shape. In this case, the insulating layer 106 is formed by curing a resin precursor with energy irradiation, such as heat and light, or by chemical reaction.

The first electrode 107 is composed of a multi-layered film of an alloy of Au and Zn, and Au, for example.

Furthermore, the second electrode 109 is formed on the back surface of the semiconductor substrate 101. That is, in the light-receiving element 100, the top surface 130a of the columnar part 130 contacts the first electrode 107, and the back surface of the semiconductor substrate 101 contacts the second electrode 109. The second electrode 109 is composed of a multi-layered film of an alloy of Au and Ge, and Au, for example.

The materials used to form the first electrodes 107 and second electrodes 109 are not limited to the above-described examples. For example, metals of Ti, Pt or the like, or alloys of these metals are applicable.

Furthermore, the anti-reflective layer 105 can be formed on the light-receiving surface 108, as required. By forming the anti-reflective layer 105, the reflection of the light on the light-receiving surface 108 can be reduced. This can increase the injection efficiency of the light entering the light-receiving surface 108. In this case, an optical film thickness of the anti-reflective layer 105 is expressed in $(2m-1)\lambda/4$ ($\lambda$ represents a wavelength of light entering the light-receiving surface 108 (incident light) and m represents a natural number).

The "optical film thickness" refers to a value obtained by multiplying an actual film thickness of the layer by a refraction factor thereof. For example, when the wavelength of incident light is $\lambda$ and a layer has an optical film thickness of $\lambda/4$ and a refraction factor n of 2.0, the actual film thickness of this layer is expressed in $\lambda/4/2=0.125\ \lambda$ by the fact that the actual film thickness is equal to optical film thickness/refraction factor n. Incidentally, simply saying "film thickness" in the invention refers to an actual film thickness of a layer.

Materials of the anti-reflective layer 105 are not specifically limited, however, they may be materials that have an effect of reducing the reflection factor of the incident light and allow the incident light to pass therethrough. For example, the anti-reflective layer 105 can be composed of a silicon nitride layer. Incidentally, "pass" in the invention means that after light enters a layer, the light exits from the layer, and includes not only the case where most of the light entering the layer exits from the layer but also the case where only a part of the light entering the layer exits from the layer.

Furthermore, in the light-receiving element 100, a reflective layer (not shown) can be formed between the first conductive type layer 102 and the light absorbing layer 103, as required. By forming the reflective layer, light which passed through the light absorbing layer 103 can be reintroduced to the light absorbing layer 103. This can increase the light utilizing efficiency. In particular, when the film thickness of the light absorbing layer 103 is reduced, a part of incident light passes through the light absorbing layer 103, thereby decreasing the light utilizing efficiency in the light absorbing layer 103. In this case, forming the reflective layer is effective from the viewpoint of increasing the light utilizing efficiency.

2. Operation of Light-Receiving Element

General operation of the light-receiving element 100 according to the exemplary embodiment will be described below. The case where the first conductive type is of n-type and the second conductive type is of p-type will be described. The method to drive the light-receiving element described below is only an example, and various modifications can be made without departing from the intent of the present invention.

Firstly, light having a predetermined wavelength enters the optical member 111. The incident light is converged by the optical member 111 and enters the light-receiving surface 108. The incident light through the light-receiving surface 108 generates the light excitation in respective layers constituting the columnar part 130 (semiconductor layer) to generate electrons and positive holes. At this time, in the light absorbing layer 103, the electrons are accumulated in the vicinity of an interface with the first conductive type layer 102, and the positive holes are accumulated in the vicinity of an interface with the second conductive type layer 104. When more than a predetermined amount of electrons and positive holes are accumulated in the light absorbing layer 103, the electrons move to the first conductive type layer 102, and the positive holes move to the second conductive type layer 104. As a result, a current flows in the direction from the first conductive type layer 102 to the second conductive type layer 104 (a direction Z in FIG. 1). At this time, if an electric field is impressed to the light absorbing layer 103 so that a potential on the side of the first conductive type layer 102 becomes higher than the second conductive type layer 104, the separation of generated electrons and positive holes becomes easy and the probability of recombination is reduced, thereby increasing the photoelectric conversion efficiency.

3. Manufacturing Method of Light-Receiving Element

Next, an example of the manufacturing method of the light-receiving element 100 according to the first exemplary embodiment of the present invention will be described referring to FIGS. 3 through 9. FIGS. 3 through 9 are schematic cross sectional views, each showing a manufacturing step of the light-receiving element 100 according to the exemplary embodiment shown in FIGS. 1 and 2, and corresponding to the cross section shown in FIG. 1.

Figure 3:
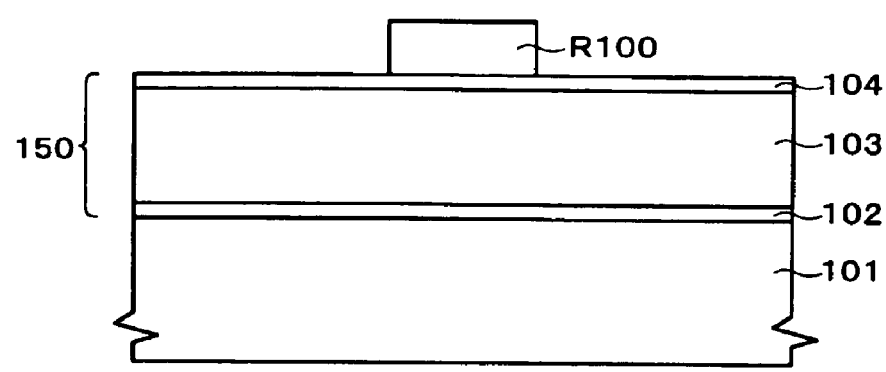
FIG. 3 is a schematic cross sectional view showing an exemplary manufacturing step of the light-receiving element in FIGS. 1 and 2.

(1) First, on the surface of the semiconductor substrate 101 made of n-type GaAs, a semiconductor multi-layered film 150 is formed by generating epitaxial growth while modulating the composition (refer to FIG. 3).

As shown in FIG. 3, the semiconductor multi-layered film 150 is composed by depositing the first conductive type layer 102, the light absorbing layer 103, and the second conductive type layer 104 in order. Furthermore, each of the layers is made of GaAs. The first conductive type layer 102 is doped with Si (silicone) so as to be of n-type and the second conductive type layer 104 is doped with C (carbon) so as to be of p-type. Furthermore, the reflective layer (not shown) is made to grow in a predetermined position, as required.

Although the temperature for the epitaxial growth is determined in each case in accordance with growth method, raw material, the type of the semiconductor substrate 101, or type, thickness, and carrier density of the semiconductor multi-layered film 150 to be formed, in general, the temperature is in the range of 450 to 800° C., preferably. The time required for the epitaxial growth is also determined in each case as in the temperature. Furthermore, as a method of epitaxial growth, MOVPE (Metal-Organic Vapor Phase Epitaxy) method, MBE (Molecular Beam Epitaxy) method, or LPE (Liquid Phase Epitaxy) method can be used.

Subsequently, after applying photoresist (not shown) on the semiconductor multi-layered film 150, a resist layer R100 of a predetermined pattern is formed by patterning the photoresist using a photolithography method (refer to FIG. 3).

Figure 4:
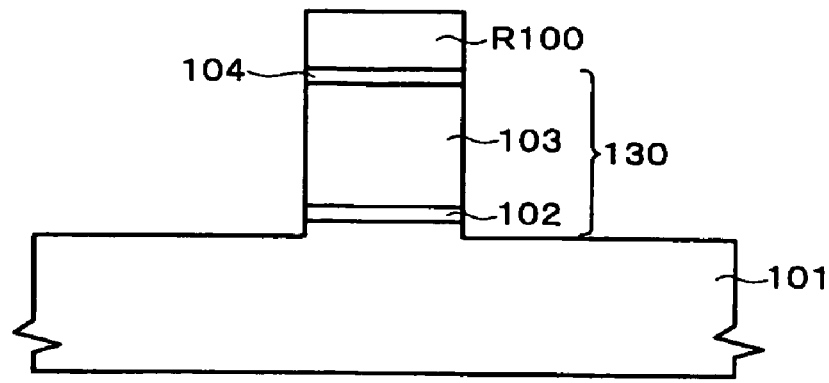
FIG. 4 is a schematic cross sectional view showing an exemplary manufacturing step of the light-receiving element in FIGS. 1 and 2.

(2) Thereafter, by partially etching (for example, using a dry etching method) the second conductive type layer 104, the light absorbing layer 103, the first conductive type layer 102, and the semiconductor substrate 101 using the resist layer R100 as a mask, the columnar semiconductor stacked structure (columnar part) 130 is formed (refer to FIG. 4). Thereafter, the resist layer R100 is removed.

(3) Subsequently, the insulating layer 106 encompassing the columnar part 130 is formed (refer to FIGS. 5 and 6). The case where polyimide resin is used as a material to form the insulating layer 106 will be described.

First, a resin precursor (polyimide precursor) is applied on the semiconductor substrate 101, for example, using a spin coat method, to effect imidization. Thereby, the insulating layer 106 is formed as shown in FIG. 5. The insulating layer 106 covers the side wall 130b of the columnar part 130. Furthermore, the insulating layer 106 shown in FIG. 5 is formed in such a manner that it covers the top surface 130a of the columnar part 130 and a portion of the insulating layer 106 formed on the substrate 101 has a thicker film thickness than a height $h_1$ of the columnar part 130.

As for the forming method of the resin precursor layer, in addition to the above-described spin coat method, suitable techniques, such as dipping method, spray coat method, and ink jet method can be used.

Figure 5:
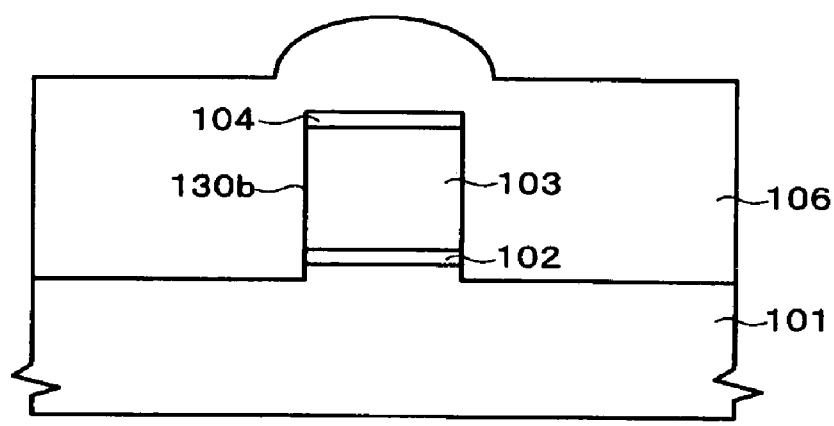
FIG. 5 is a schematic cross sectional view showing an exemplary manufacturing step of the light-receiving element in FIGS. 1 and 2.
Figure 6:
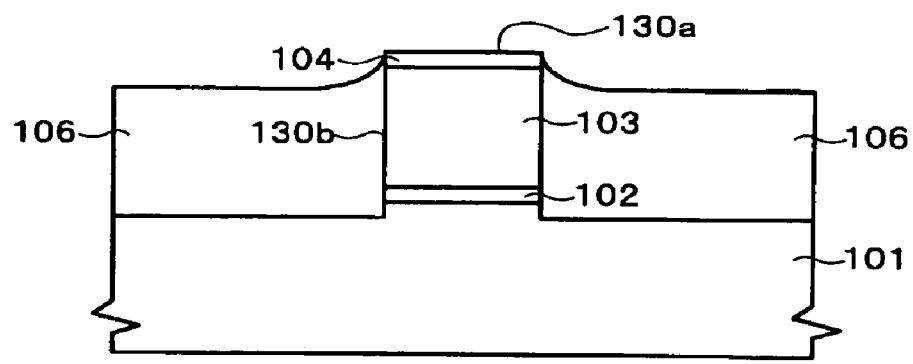
FIG. 6 is a schematic cross sectional view showing an exemplary manufacturing step of the light-receiving element in FIGS. 1 and 2.

Thereafter, the insulating layer 106 shown in FIG. 5 is subjected to the isotropic etching in the direction from the top surface 130a of the columnar part 130 to the substrate 101. Thereby, as shown in FIG. 6, in the vicinity of the columnar part 130, the insulating layer 106 is formed in a manner so as to have a thicker film thickness as it becomes closer to the columnar part 130. As for the isotropic etching, either the dry etching or the wet etching can be used. Specifically, as the isotropic etching, a method described in Japanese laid-open patent publication No. 13-066299 can be used.

Figure 7:
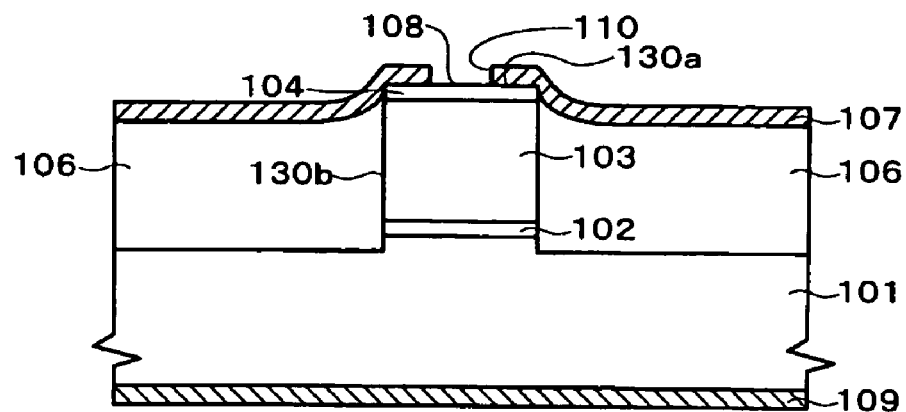
FIG. 7 is a schematic cross sectional view showing an exemplary manufacturing step of the light-receiving element in FIGS. 1 and 2.

(4) Next, the first electrode 107 and the second electrode 109, and the light-receiving surface 108 are formed (refer to FIG. 7).

First, before the first electrode 107 and the second electrode 109 are formed, the top surface 130a of the columnar 130 is cleaned using a plasma treatment method or the like, as required. This enables an element having more stable properties to be formed. Subsequently, after a multi-layered film (not shown) made of an alloy of Au and Zn, and Au, for example, is formed on the top surface of the insulating layer 106 and the top surface 130a of the columnar part 130 using the vacuum deposition method, for example, a portion (the opening 110), which does not have the multi-layered film formed thereon, is formed on the top surface 130a of the columnar part 130 using the lift off method. This allows the region inside of the opening 110 to function as the light-receiving surface 108. Incidentally, in the above-described step, the dry etching method can be used instead of the lift off method.

Furthermore, a multi-layered film (not shown) made of, for example, an alloy of Au and Ge, and Au, is formed on the back surface of the semiconductor substrate 101 using the vacuum deposition method, for example, and then is subjected to an annealing treatment, thereby forming ohmic contact. The temperature of the annealing treatment depends on the electrode material. Typically, the electrode material used in the exemplary embodiment is treated at about 400° C. Through the above-described steps, the first electrode 107 and the second electrode 109 are formed (refer to FIG. 7).

Subsequently, the anti-reflective layer 105 is formed on the light-receiving surface 108 using a plasma CVD method or the like, as required (refer to FIG. 8).

(5) Next, the optical member 111 is formed on the top surface 130a of the columnar part 130 (refer to FIGS. 8 and 9). As for the exemplary embodiment, the case where the optical member 111 (refer to FIG. 1) is formed on the top surface 130a of the columnar part 130 via the first electrode 107 will be described.

First, a treatment to adjust a wet angle of the optical member 111 is performed to the top surface 130a of the columnar part 130, as required. This step enables the optical member precursor 111b with a preferable shape to be obtained when the liquid material 111a is introduced on the top surface 130a of the columnar part 130 in the step described later. As a result, the optical member 111 having a preferable shape can be obtained (refer to FIGS. 8 and 9).

Subsequently, a droplet of the liquid material 111a is discharged onto the top surface 130a of the columnar part 130 using an ink jet method, for example. As for discharging methods of the ink jet, (i) a method of generating pressure by changing the sizes of bubbles in the liquid (material for lens) with heat so as to discharge the liquid and (ii) a method of generating pressure with a piezoelectric element so as to discharge the liquid, are exemplies. The method (ii) is preferable from the viewpoint of pressure controllability.

The alignment of the nozzle position of an ink jet head and the discharging position of the droplet is performed using suitable image recognition techniques used in an exposure process or inspection process in a general manufacturing process of semiconductor integrated circuit. For example, as shown in FIG. 8, the position of a nozzle 112 of an ink jet head 120 and the position of the columnar part 130 are aligned. After the alignment, the voltage applied to the ink jet head 120 is controlled and then the droplet of the liquid material 111a is discharged. Thereby, as shown in FIG. 9, the optical member precursor 111b is formed on the top surface 130a of the columnar part 130.

In this case, as shown in FIG. 8, the liquid material 111a is deformed due to surface tension when the plurality of droplets, discharged from the nozzle 112, lands on the top surface 130a of the columnar part 130, and the liquid material 111a comes to the center of the top surface 130a of the columnar part 130. Thereby, the position is automatically corrected.

Furthermore, in this case, the optical member precursor 111b (refer to FIG. 9) obtains a shape and size in accordance with the shape and size of the top surface 130a of the columnar part 130, the discharging amount of the liquid material 111a, the surface tension of the liquid material 111a, number of the droplets of the liquid material 111a, and the interfacial tension between the top surface 130a of the columnar part 130 and the liquid material 111a. Accordingly, by controlling these factors, the shape and size of the optical member 111 obtained finally (refer to FIG. 1) can be controlled, thereby enhancing the flexibility in lens design.

After performing the above-described steps, as shown in FIG. 9, the optical member precursor 111b is cured by irradiation of an energy beam 113 (for example, ultraviolet rays) to form the optical member 111 on the top surface 130a of the columnar part 130 (refer to FIG. 1). At this time, an optimal wavelength and amount of the ultraviolet rays depend on the material of the optical member precursor 111b. For example, in the case where the optical member precursor 111b is formed using a precursor of acrylic UV-curable resin, it is irradiated for five minutes by ultraviolet rays having a wavelength of about 350 nm and an intensity of 10 mW to be cured. Through the above-described steps, the light-receiving element 100 according to the exemplary embodiment can be obtained as shown in FIG. 1.

4. Actions and Effects

The light-receiving element 100 according to the exemplary embodiment has actions and effects described below.

(A) First, because the optical member 111 is formed on the light-receiving surface 108, a amount of light per unit cross section area, which is introduced to the light absorbing layer 103, can be increased. This allows the film thickness of the light absorbing layer 103 to be thinner, thereby decreasing the distance that the electrons and the positive holes moves to the electrodes (the first electrode 107 and the second electrode 109). As a result, a high-speed operation becomes possible while maintaining the light-receiving sensitivity.

Furthermore, because the light absorbing layer 103 has a high insulation performance in general, the capacitance of the light-receiving element 100 is increased in proportion to the cross sectional area of the light absorbing layer 103. The increase of capacitance is a factor reducing or preventing the high-speed operation of the element. By contrast, in the light-receiving element 100 according to the exemplary embodiment, because the amount of light per unit cross sectional area, which is introduced to the light absorbing layer 103, can be increased as above described, the cross section area of the light absorbing layer 103 can be decreased. Because this can reduce the capacitance, higher-speed operation becomes possible while maintaining the light utilizing efficiency.

(B) Second, the size and shape of the optical member 111 can be controlled strictly. In order to form the optical member 111, in the step of forming the optical member 111 as described in the step (5), the optical member precursor 111b is formed on the top surface 130a of the columnar part 130 (refer to FIGS. 8 and 9). At this time, as long as a portion of the first electrode 107, formed on the insulating layer 106 and in the vicinity of the columnar part 130, is not wetted with the liquid material composing the optical member precursor 110a, the surface tension of the columnar part 130 does not act on the optical member precursor 111b, but the surface tension of the liquid material mainly acts. Therefore, the shape of the optical member precursor 111b can be controlled by controlling the amount of the liquid material (droplet 111a) used for forming the optical member 111. Thereby, the optical member 111 whose shape is more strictly controlled can be formed. As a result, the optical member 111 having a desired shape and size can be obtained.

(C) Third, the setting position of the optical member 111 can be strictly controlled. As described above, the optical member 111 is formed by discharging the droplet of the liquid material 111b onto the top surface 130a of the columnar part 130 to form the optical member precursor 111b and curing the optical member precursor 111b (refer to FIG. 9). In general, a strict control of the landing position of the discharged droplet is difficult. This method, however, allows the optical member 111 to be formed on the top surface 130a of the columnar part 130 without performing special alignment. That is, by only discharging the droplet 111a onto the top surface 130a of the columnar part 130, the optical member precursor 111a can be formed without alignment. To put it differently, the optical member 111 can be formed with the alignment accuracy, which is applied when the columnar part 130 is formed. Thereby, the optical member 111 whose setting position is controlled can be formed with ease and with good yield.

In particular, in the case where the droplet 111b is discharged using the ink jet method, the droplet 111b can be discharged in a more precise position, so that the optical member 111 whose setting position is controlled more strictly can be formed with ease and with good yield. Furthermore, by discharging the droplet 111b using the ink jet method, the amount of the discharged droplet 111b can be controlled in units of pico-liter order, thereby a microscopic structure can be produced precisely.

(D) Fourth, by setting the shape and area of the top surface 130a of the columnar part 130, the shape and size of the optical member 111 can be set. In particular, by selecting the shape of the top surface 130a of the columnar part 130 in each case, the optical member 111 having a predetermined function can be formed. Accordingly, by changing the shape of the top surface 130a of the columnar part 130, optical members having different functions can be integrated on the same substrate.

(E) Fifth, in the vicinity of the columnar part 130, the insulating layer 106 has a thicker film thickness as it becomes closer to the columnar part 130. To put it differently, in the vicinity of the columnar part 130, the film thickness of the insulating layer 106 becomes smaller precipitously with distancing away from the columnar part 130. Thereby, in the step (5), when forming the optical member precursor 111b on the top surface 130a of the columnar part 130, the portion of the first electrode 107, which is formed on the insulating layer 106 and in the vicinity of the columnar part 130, can be securely prevented from being wetted with the liquid material composing the optical member precursor 110a. This allows the optical member 111 to be securely set on the top surface 130a of the columnar part 130.

Second Exemplary Embodiment

1. Structure of Light-Receiving Element

Figure 10:
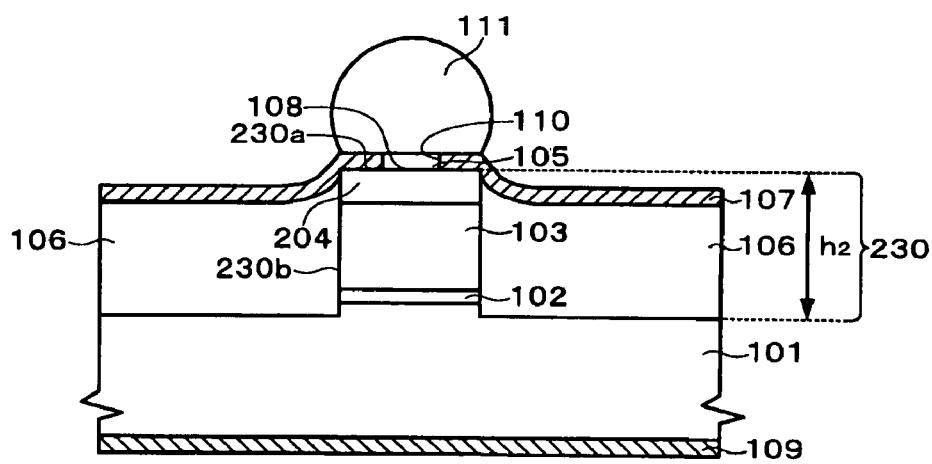
FIG. 10 is a schematic cross sectional view showing a light-receiving element according to a second exemplary embodiment of the present invention.

FIG. 10 is a schematic cross sectional view showing a light-receiving element 200 according to a second exemplary embodiment of the present invention. As for the exemplary embodiment, a case where the light-receiving element 200 is a photodiode as in the first exemplary embodiment will be described.

In the light-receiving element 200 according to the exemplary embodiment, a height $h_2$ of a columnar part 230 is higher than the height $h_1$ of the columnar part 130 in the light-receiving element 100 according to the first exemplary embodiment (refer to FIG. 10). The reason is that the film thickness of a second conductive type layer 204 included in the columnar part 230 is thicker than that of the second conductive type layer 104 included in the columnar part 130 of the light-receiving element 100 according to the first exemplary embodiment.

The light-receiving part 200 according to the exemplary embodiment has a different structure from that of the light-receiving element 100 according to the first exemplary embodiment, in that the first exemplary embodiment includes the columnar 130 including the second conductive type layer 104 and the second conductive layer 104 is made of a GaAs layer, and the second exemplary embodiment includes the columnar part 230 including the second conductive layer 204 and that the main components of the second conductive layer 204 mainly are Ga, As, and Al.

Furthermore, the columnar part 230 is embedded in an insulating layer 106. That is, a side wall 230b of the columnar part 230 is encompassed with the insulating layer 106. As for the light-receiving element 200 according to the exemplary embodiment, the insulating layer 106 covers the side wall 230b of the columnar part 230 and the top surface of the substrate 101.

Because other structures of the second exemplary embodiment are the same as those of the light-receiving element 100 according to the first exemplary embodiment, the same components as those of the light-receiving element 100 are indicated by the same numerals, and a detailed description will be omitted.

A wavelength of light required to drive a light-receiving element is determined by the material of the light absorbing layer thereof. For example, in the light-receiving element 200 according to the exemplary embodiment, the light absorbing layer 103 is composed of a GaAs layer. The GaAs layer absorbs light having a wavelength of not more than 870 nm. Because the light absorbing layer 103 is composed of GaAs layers, the light absorbing layer 103 functions as a light absorbing layer with respect to light having a wavelength of not more than 870 nm, while it does not function as a light absorbing layer with respect to light having a wavelength exceeding 870 nm.

Furthermore, the light-receiving element 200 according to the exemplary embodiment is provided with the light-receiving surface 108 on the top surface of the second conductive type layer 104 as in the light-receiving element 100 according to the first exemplary embodiment. That is, the incident light through the light-receiving surface 108 propagates in the second conductive type layer 104 and then enters the light absorbing layer 103.

Generally, in the light-receiving element, by enhancing the photoelectric conversion efficiency in the light absorbing layer, lower power consumption can be achieved. Accordingly, as for the light-receiving element 200, to enhance the photoelectric conversion efficiency in the light absorbing layer 103, it is preferable to absorb more light in the light absorbing layer 103. To achieve this, it is preferable that the incident light through the light-receiving surface 108 is absorbed as little as possible by the second conductive type layer 204 before entering the light absorbing layer 103.

As described above, as for the light-receiving element 200 according to the exemplary embodiment, the second conductive type layer 204 is composed of an AlGaAs layer. Generally, as the composition of Al in the AlGaAs layer becomes higher, the absorption wavelength of the AlGaAs layer shifts to the shorter wavelength side.

For example, an $Al_{0.15}Ga_{0.85}As$ layer absorbs light having a wavelength of not more than 770 nm. In addition, as described above, the light absorbing layer 103 composed of a GaAs layer absorbs light having a wavelength of not more than 870 nm. Accordingly, as for the light-receiving element 200 according to the exemplary embodiment, in the case where the second conductive type layer 204 is composed of the $Al_{0.15}Ga_{0.85}As$ layer, light having a wavelength between 770 nm and 870 nm is not absorbed by the second conductive type layer 104 and introduced to the light absorbing layer 103 efficiently. This can enhance light utilizing efficiency.

More specifically, when designing a photodiode driven by light having a wavelength of 850 nm, by using the second conductive type layer 104 composed of the $Al_{0.15}Ga_{0.85}As$ layer and the light absorbing layer 103 composed of the GaAs layer, the light having the wavelength of 850 nm is not absorbed in the second conductive type layer 104 and the light having the wavelength of 850 nm is absorbed in the light absorbing layer 103. Thus the light having the wavelength of 850 nm can be absorbed by the light absorbing layer 103 efficiently, after passing through the second conductive type layer 104.

The composition of Al in the second conductive type layer 204 can be adjusted in each case in accordance with the wavelength of light to be absorbed in the light absorbing layer 103. On the other hand, as for the exemplary embodiment, the first electrode 107 is formed on the second conductive type layer 104. Thus, when the second conductive type layer 204 is expressed in $Al_xGa_{1-x}As$ (wherein 0<x<1) with respect to the composition of Al in the second conductive layer 204, it is preferable that x should be less than 0.2 in order to achieve good ohmic contact for the second conductive type layer 204.

In the light-receiving element 100 according to the first exemplary embodiment, the second conductive type layer 104 is composed of a GaAs layer similar to the light absorption layer 103. That is, the second conductive type layer 104 also absorbs the light absorbed by the light-receiving layer 103. Accordingly, as the film thickness of the second conductive type layer 104 is thicker, out of incident light through the light-receiving surface 108, the amount of light absorbed by the second conductive layer 104 before reaching the light absorbing layer 103 is increased. That is, as the film thickness of the second conductive type layer 104 becomes thicker, the amount of light reaching the light absorbing layer 103 is reduced.

By contrast, as above described, as for the light-receiving element 200 according to the exemplary embodiment, the light absorbing layer 103 is formed so as to absorb light having a predetermined wavelength and the second conductive type layer 204 is formed so as not to absorb the light having the predetermined wavelength. For example, as above described, in the case where the light absorbing layer 103 is composed of a GaAs layer and the second conductive type layer 204 is composed of an $Al_{0.15}Ga_{0.85}As$ layer, the light absorbing layer 103 absorbs light having a predetermined wavelength (between 770 nm and 870 nm) and the second conductive layer 204 does not absorb the light having the predetermined wavelength (between 770 nm and 870 nm). Therefore, even if the film thickness of the second conductive type layer 204 becomes thicker, the absorption of light in the light absorbing layer 103 is not prevented. Incidentally, as described above, the wavelength of the light which is not absorbed in the second conductive type layer 204 is determined by the composition of Al of the second conductive type layer 204.

As for the exemplary embodiment, the case where the light absorbing layer 103 is composed of a GaAs layer was described. However, an InGaAs layer can be used to form the light absorbing layer 103 instead of the GaAs layer. Because the InGaAs layer can absorb light having a wavelength range of more than 870 nm, by adjusting the composition ratio of In, a photodiode, which is accommodated to a wavelength range of more than 870 nm, can be designed. On the other hand, the GaAs layer does not absorb light having a wavelength of more than 870 nm. Accordingly, in this case, even if the GaAs layer is used as the second conductive type layer, a similar effect in the exemplary embodiment can be obtained. This can be similarly applied to the first exemplary embodiment.

2. Operation of Light-Receiving Element

Because the operation of the light-receiving element 200 according to the exemplary embodiment is basically similar to that of the light-receiving element 100 according to the first exemplary embodiment, a detailed explanation is omitted.

3. Manufacturing Method of Light-Receiving Element

A manufacturing method of the light-receiving element 200 according to the exemplary embodiment is similar to that of the light-receiving element 100 according to the first exemplary embodiment except that the second conductive type layer 204 composed of p-type AlGaAs is formed instead of the second conductive layer 104 composed of p-type GaAs. Accordingly, a detailed description is omitted.

4. Actions and Effects

The light-receiving element 200 according to the exemplary embodiment and its manufacturing method have substantially the same actions and effects as the light-receiving element 100 according to the first exemplary embodiment and its manufacturing method. In addition, the light-receiving element 200 according to the exemplary embodiment and its manufacturing method have the following actions and effects.

As for the light-receiving element 200 according to the exemplary embodiment, the second conductive type layer 204 is composed of an AlGaAs layer. As above described, the second conductive type layer 204 is made of a material which does not absorb light having a predetermined wavelength that is absorbed by the light absorbing layer 103.

Thus, the film thickness of the second conductive type layer 204 can be increased without reducing light absorption efficiency in the light absorbing layer 103. As a result, the height of the columnar part 230 can be increased while maintaining light utilizing efficiency. This enables the optical member 111 to be securely formed on the top surface 230a of the columnar part 230. The reason is explained as below.

According to the exemplary embodiment, the insulating layer 106 is formed with the method described in the first exemplary embodiment. In the forming step of the insulating layer 106, by increasing the film thickness of the second conductive type layer 204, the height of the columnar part 230 can be increased. For this reason, as shown in FIG. 10, in the vicinity of the columnar part 230, the film thickness of the insulating layer 106 is increased precipitously as it becomes closer to the columnar part 230. To put it differently, in the vicinity of the columnar part 130, the thickness film of the insulating layer 106 is reduced precipitously as it become farther from the columnar part 130. For this reason, when the optical member precursor 111b is formed on the top surface 130a of the columnar part 130, a portion of the first electrode 107, formed on the insulating layer 106 and in the vicinity of the columnar part 130, is securely prevented from being wetted with the liquid material composing the optical member precursor 110a. Thereby, the optical member 111 can be securely set on the top surface 130a of the columnar part 130.

Third Exemplary Embodiment

Figure 11:
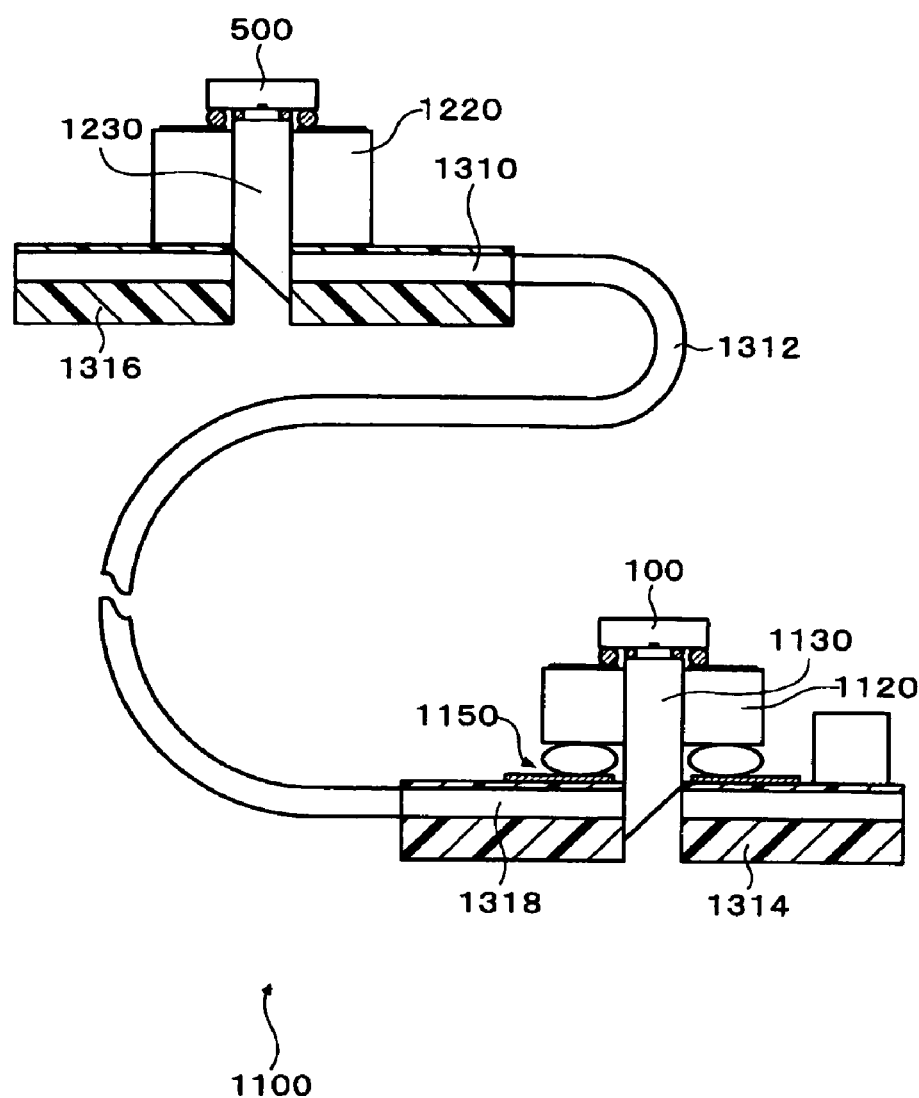
FIG. 11 is a schematic showing an optical module according to a third exemplary embodiment of the present invention.

FIG. 11 is a schematic showing an optical transmitting device according to a third exemplary embodiment of the present invention. An optical transmitting device 1100 according to the exemplary embodiment includes the light-receiving element 100 according to the first exemplary embodiment, a light emitting element 500, and light guides to propagate light emitted from the light emitting element 500 and to introduce the light to the light-receiving element 100. In addition, an optical module includes the light-receiving element 100 and a light guide (a first light guide 1130) for propagating light that is introduced to the light-receiving element 100.

As for the exemplary embodiment, a third light guide 1312 is arranged between a structure of the light-receiving element 100 part (including the light-receiving element 100, a platform 1120, a substrate 1314, the first light guide 1130, a second light guide 1318 and an actuator 1150) and a structure of the light emitting element 500 part (including the light emitting element 500, a platform 1220, a substrate 1316, and the third light guides 1230, and 1310). By using an optical fiber or the like for the third light guide 1312, optical transmission between a plurality of electronic devices can be performed.

In the optical transmitting device 1100 according to the exemplary embodiment, after light is emitted from the light emitting element 500, the light propagates into the third light guides 1312, 1310 and 1230, the second light guide 1312 and the first light guide 1130 and then is introduced to the light-receiving element 100.

Figure 12:
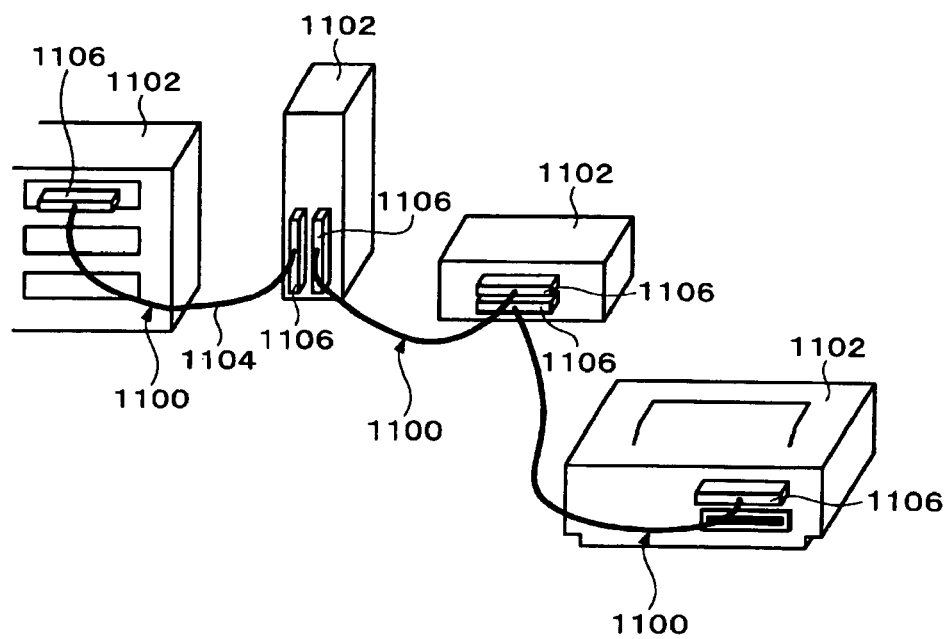
FIG. 12 is a schematic showing an optical transmitting device according to a third exemplary embodiment of the present invention.

For example, as shown in FIG. 12, the optical transmitting device 1100 connects electronic devices 1102, such as a computer, a display, a storage device, and a printer with each other. The electronic device 1102 may be an information and communication device. The optical transmitting device 1100 includes a cable 1104 having the third light guide 1312 of an optical fiber or the like. As for the optical transmitting device 1100, plugs 1106 may be provided at both ends of the cable 1104. Within each of the plugs 1106, the structures of the light-receiving element 100 part and the light emitting element 500 part are provided. An electric signal outputted from one of the electronic devices 1102 is converted into a light signal by the light emitting element and the light signal is transmitted to the cable 1104 to be converted an electric signal by the light-receiving element. Then the electric signal is inputted to another electronic device 1102. In this manner, according to the optical transmitting device 1100 of this exemplary embodiment, information can be transmitted with the light signal between the electronic devices 1102.

Figure 13:
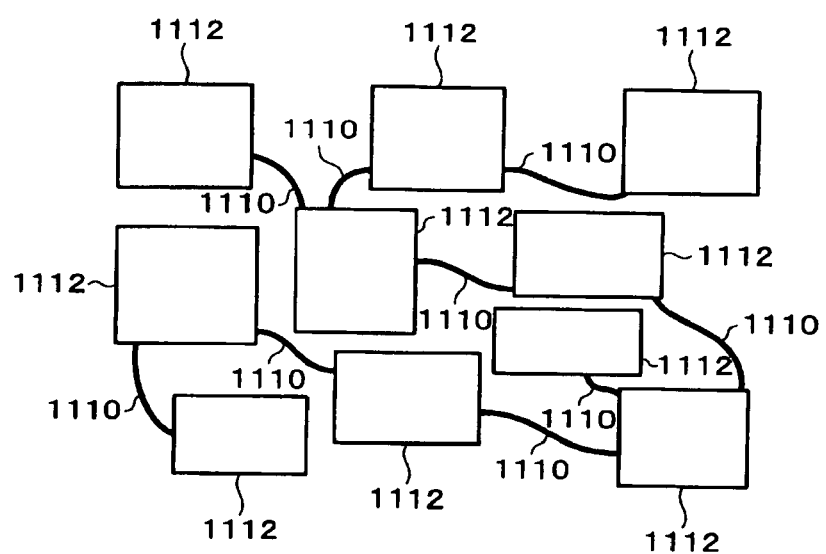
FIG. 13 is a schematic showing the optical transmitting device according to a third exemplary embodiment of the present invention.

FIG. 13 shows a schematic for a usage of the optical transmitting device according to an exemplary embodiments of the present invention. An optical transmitting device 1112 provides a connection between electronic devices 1110. The electronic device 1110 includes a liquid crystal display monitor or digital adaptive CRT (which may be used in finance, teleshopping, medical service, and education fields), liquid crystal projector, plasma display panel (PDP), digital TV, cash register in a retail store (for POS (Point of Sale Scanning)), video, tuner, game device, printer, and the like.

As for the exemplary embodiments (refer to FIGS. 11 through 13), the case where the light-receiving element 200 according to the second exemplary embodiment is used instead of the light-receiving element 100 according to the first exemplary embodiment can perform similar actions and effects.

That is, the present invention is not limited to the above-described exemplary embodiments and various modifications can be made. For example, an aspect of the present invention may include a substantially similar structure (for example, a structure having the same functions, methods and results or a structure having the same purpose and results) as those explained in the above-described exemplary embodiments. Furthermore, the present invention may include a structure obtained by replacing an unessential part in the structures explained in the above-described exemplary embodiments. Still furthermore, the present invention may include a structure having the same actions and effects or a structure capable of achieving the same purpose as those explained in the above-described exemplary embodiments. Still furthermore, the present invention includes a structure in which the publicly known art is added to the structures described in the exemplary embodiments.

For example, as for the above-described exemplary embodiments, the p-type and n-type of each semiconductor layer may be interchanged without departing from the intent of the present invention. Furthermore, as for the above-described exemplary embodiments, the light-receiving elements having one columnar part are described, but providing a plurality of columnar parts on the substrate surface does not impair the exemplary embodiments of the present invention. Alternatively, even if a plurality of light-receiving elements are arrayed, similar actions and effects can be achieved.

Furthermore, in the above-described exemplary embodiments, for example, the cases using AlGaAs-based and InGaAs-based semiconductor materials are explained, but other materials, for example Si-based or GaInNAs-based semiconductor material, may be used in accordance with the wavelength of light absorbed in the light absorbing layer.

What is claimed is:

1. A light-receiving element, comprising:
   a substrate;
   a columnar part provided on the substrate;

a top surface of the columnar part including a light-receiving surface;
an anti-reflective layer provided on the light-receiving surface; and
an optical member provided on a top surface of the anti-reflective layer, a diameter of the optical member being greater than a diameter of the top surface of the columnar part, the maximum value of the diameter of the optical member being larger than the diameter of the lower surface of the optical member;
the columnar part including a first conductive type layer, a light absorbing layer, and a second conductive type layer;
the light absorbing layer being formed between the first conductive type layer and the second conductive type layer; and
the light receiving surface being a top surface of the second conductive type layer,
in a vicinity of the columnar part, an insulating layer having a thicker film thickness as the insulating layer becomes closer to the columnar part.

2. The light-receiving element according to claim 1, wherein:
an incident light through the light-receiving surface propagates in the second conductive type layer and then enters the light absorbing layer;
the light absorbing layer absorbs light having a predetermined wavelength; and
the second conductive type layer unabsorbs the light having a predetermined wavelength.

3. The light-receiving element according to claim 2, wherein:
the incident light from the light-receiving surface propagates in the second conductive type layer and then enters the light absorbing layer;
the first conductive type layer and the light absorbing layer contains gallium (Ga) and arsenic (As) as main components; and
the second conductive type layer contains gallium (Ga), arsenic (As), and aluminum (Al) as main components.

4. The light-receiving element according to claim 1, wherein the optical member functions as a lens.

5. The light-receiving element according to claim 1, wherein the optical member functions as a deflecting element.

6. The light-receiving element according to claim 1, wherein the optical member has a spherical shape or an elliptical spherical shape.

7. The light-receiving element according to claim 1, wherein the optical member has a cut spherical shape or a cut elliptical spherical shape.

8. The light-receiving element according to claim 1, wherein a cross section of the optical member is circular or elliptical.

9. The light-receiving element according to claim 1, wherein the optical member is formed by curing a curable liquid material by applying energy thereto.

10. The light-receiving element according to claim 9, wherein the optical member is made of UV-curable resin.

11. The light-receiving element according to claim 1, wherein the top surface of the columnar part is circular or elliptical.

12. The light-receiving element according to claim 1, wherein a side wall of the columnar part is covered by the insulating layer.

13. The light-receiving element according to claim 1, wherein the light-receiving element is a photodiode.

14. An optical module, comprising the light-receiving element according to claim 1 and a light guide.

15. An optical transmitting device, comprising:
the optical module according to claim 14.

16. The light-receiving element according to claim 1, wherein a film thickness of the second conductive type layer is greater than a film thickness of the first conductive type layer.

17. The light-receiving element according to claim 1, a maximum diameter of the optical member being greater than a diameter of the bottom surface of the optical member.

18. A light-receiving element, comprising:
a substrate;
a columnar part provided on the substrate, the columnar part including only three layers;
a top surface of the columnar part including a light-receiving surface;
an optical member being provided on the top surface of the columnar part, a diameter of the optical member being greater than a diameter of the top surface of the columnar part;
the columnar part including a first conductive type layer, a light absorbing layer, and a second conductive type layer;
the light absorbing layer being formed between the first conductive type layer and the second conductive type layer; and
an electrode being formed on the top surface of the columnar part,
the electrode having an opening, and
the light-receiving surface being formed on the opening,
in a vicinity of the columnar part, an insulating layer having a thicker film thickness as the insulating layer becomes closer to the columnar part.

19. The light-receiving element according to claim 18, wherein the optical member is provided over the top surface of the columnar part and over a portion of the electrode.

20. The light-receiving element according to claim 18, wherein the diameter of the optical member is greater than a diameter of the opening.

21. A manufacturing method of a light-receiving element, comprising:
(a) forming on a substrate, a columnar part including a first conductive type layer, a light absorbing layer, and a second conductive type layer, the light absorbing layer being formed between the first conductive type layer and the second conductive type layer, and a light-receiving surface on a top surface of the second conductive type layer, an insulating layer covering a side wall of the columnar part being formed, and in the vicinity of the columnar part, the insulating layer having a thicker film thickness as the insulating layer becomes closer to the columnar part;
(b) forming an anti-reflective layer on the light-receiving surface;
(c) forming an optical member precursor by discharging a droplet onto the top surface of the anti-reflective layer; and
(d) forming an optical member by curing the optical member precursor, a diameter of the optical member being greater than a diameter of the top surface of the columnar part.

22. The manufacturing method of the light-receiving element according to claim 21, further comprising:
(d) adjusting the wettability of the top surface of the anti-reflective layer with respect to the droplet, prior to the step (c).

23. The manufacturing method of the light-receiving element according to claim 21, in (a), the insulating layer being deposited in such a manner so as to cover the top surface of the columnar part, and then the insulating layer being subjected to isotropic etching in the direction from the top surface of the columnar part to the substrate.

* * * * *